(12) United States Patent
Bak (10) Patent No.: US 11,501,988 B2
(45) Date of Patent: Nov. 15, 2022

(54) CONVEYOR SYSTEM

(71) Applicant: SEMES CO., LTD., Chungcheongnam-do (KR)

(72) Inventor: Hyeongjin Bak, Hwaseong-si (KR)

(73) Assignee: SEMES CO., LTD., Chungcheongnam-Do (KR)

(*) Notice: Subject to any disclaimer, the term of this patent is extended or adjusted under 35 U.S.C. 154(b) by 0 days.

(21) Appl. No.: 17/143,265

(22) Filed: Jan. 7, 2021

(65) Prior Publication Data

US 2021/0210367 A1 Jul. 8, 2021

(30) Foreign Application Priority Data

Jan. 8, 2020 (KR) .................... 10-2020-0002416

(51) Int. Cl.
| | |
|---|---|
| *H01L 21/67* | (2006.01) |
| *H01L 21/677* | (2006.01) |
| *B65G 43/08* | (2006.01) |
| *B65G 47/31* | (2006.01) |
| *B65G 43/10* | (2006.01) |

(52) U.S. Cl.
CPC ........ *H01L 21/67259* (2013.01); *B65G 43/08* (2013.01); *B65G 43/10* (2013.01); *B65G 47/31* (2013.01); *H01L 21/6773* (2013.01); *H01L 21/67727* (2013.01); *B65G 2201/0297* (2013.01); *B65G 2203/0233* (2013.01); *B65G 2203/047* (2013.01)

(58) Field of Classification Search
CPC ......... H01L 21/67259; H01L 21/67727; H01L 21/6773; B65G 43/08; B65G 43/10; B65G 47/30; B65G 47/31; B65G 2201/0297; B65G 2203/0233; B65G 2203/047

USPC .......................................... 198/460.1, 461.1
See application file for complete search history.

(56) References Cited

U.S. PATENT DOCUMENTS

| | | | | |
|---|---|---|---|---|
| 7,793,772 | B2* | 9/2010 | Schafer ................. | B65G 47/261 198/460.1 |
| 7,938,247 | B2* | 5/2011 | Kujat ..................... | B65G 47/31 198/460.1 |
| 8,714,342 | B2* | 5/2014 | Halloran ........... | H01L 21/67745 198/460.1 |

(Continued)

FOREIGN PATENT DOCUMENTS

| | | |
|---|---|---|
| CN | 1496220 A | 5/2004 |
| CN | 101056807 A | 10/2007 |

(Continued)

OTHER PUBLICATIONS

Korean Patent Office, Notice of Allowance dated Sep. 28, 2021.
China Patent Office, Office action dated Jun. 22, 2022.

*Primary Examiner* — James R Bidwell
(74) *Attorney, Agent, or Firm* — Li & Cai Intellectual Property (USA) Office (57) ABSTRACT

A conveyor system for moving a plurality of targets is provided. The conveyor system includes at least one input group to input the target, at least one output group to output the target, and at least one bridge group to connect the input group with the output group. Each of the input group, the output group, and the bridge group includes a plurality of nodes having a size corresponding to a size of one target. The conveyor system further includes a control unit to align the target moving on the conveyor system.

13 Claims, 8 Drawing Sheets

(56) References Cited

U.S. PATENT DOCUMENTS

| | | | | |
|---|---|---|---|---|
| 2009/0145723 A1* | 6/2009 | Ogawa | ................... | B65G 47/54 |
| | | | | 198/460.1 |
| 2013/0259610 A1 | 10/2013 | Halloran et al. | | |
| 2014/0141541 A1* | 5/2014 | Tsai | ................. | H01L 21/67253 |
| | | | | 156/345.1 |
| 2019/0377331 A1* | 12/2019 | Horn | ..................... | B65G 37/02 |

FOREIGN PATENT DOCUMENTS

| | | | |
|---|---|---|---|
| CN | 101304934 A | 11/2008 | |
| CN | 101932517 A | 12/2010 | |
| CN | 103369941 A | 10/2013 | |
| JP | 06127659 A | 5/1994 | |
| JP | 2003-292146 A | 10/2003 | |
| JP | 2013199359 A | 10/2013 | |
| KR | 2019900014122 U | 8/1990 | |
| KR | 20-1991-0002592 U | 2/1991 | |
| KR | 1020170019238 A | 2/2017 | |
| KR | 101793932 | 11/2017 | |
| KR | 1020180098776 A | 9/2018 | |
| KR | 1020180134217 A | 12/2018 | |
| WO | WO 2007055112 A1 | 5/2007 | |
| WO | 2020.090323 | * 5/2020 | ............. B65G 43/02 |

\* cited by examiner

CONVEYOR SYSTEM

CROSS-REFERENCE TO RELATED APPLICATIONS

A claim for priority under 35 U.S.C. § 119 is made to Korean Patent Application No. 10-2020-0002416 filed on Jan. 8, 2020, in the Korean Intellectual Property Office, the entire contents of which are hereby incorporated by reference.

BACKGROUND

Embodiments of the inventive concept described herein relate to a conveyor system and an alignment method in the conveyor system.

A conveyor system is provided to move a plurality of targets. The target of the conveyor system may be a container in which wafers are received. According to an embodiment, the target of the conveyor system may be a Front Open Unified Pod (FOUP). The target may be moved along a specific path on the conveyor system. Accordingly, a plurality of targets move along the path in the conveyor system. In this case, positions of the plurality of targets may be tracked.

However, when a blackout or a system failure occurs during the operation of the conveyor system, the operation of the conveyor system is stopped. Although the conveyor system has to be rapidly operated again when the operation of the conveyor system is stopped, it may be difficult to operate the conveyor system again in the state that the positions of the targets disposed on the conveyor system may not be tracked. Accordingly, there is required a manner of aligning the targets on the conveyor system to track the positions of the targets moving on the conveyor system.

SUMMARY

Embodiments of the inventive concept provide a method for automatically aligning a plurality of targets present at positions, at which the targets are not tracked, such that the targets are tractable.

The technical problems to be solved by the inventive concept are not limited to the aforementioned problems, and any other technical problems not mentioned herein will be clearly understood from the following description by those skilled in the art to which the inventive concept pertains.

According to an exemplary embodiment, a conveyor system for moving a plurality of targets is disclosed. The conveyor system may include at least one input group to input the target, at least one output group to output the target, and at least one bridge group to connect the input group with the output group. Each of the input group, the output group, and the bridge group may include a plurality of nodes having a size corresponding to a size of one target. The conveyor system may further include a control unit to align the target moving on the conveyor system.

According to an embodiment, each node may include a correct position sensor, a first limit sensor to sense whether the target is positioned at one end of the node, a second limit sensor to sense whether the target is positioned at another end of the node, and a driving motor to drive the node.

According to an embodiment, the control unit may primarily align the target between some groups among the input group, the output group, and the bridge group, and secondarily align the target inside the input group, the output group, or the bridge group, when aligning the target moving on the conveyor system.

According to an embodiment, to primarily align the target between some groups among the input group, the output group, and the bridge group, the target may be determined whether to be sensed at nodes in opposite ends of each of the input group, the output group, and the bridge group, and a first group and a second group, in which the target, which is sensed, is disposed, are specified, and determined whether to be connected with each other in a line in a forward direction of a conveyor, when the target is sensed.

According to an embodiment, a driving motor at a last node in the first group and a driving motor at a first node in the second group may be driven in the forward direction of the conveyor.

According to an embodiment, the control unit may perform a control operation to stop driving of the driving motors when the correct position sensor at the last node in the first group is turned off, and when the correct position sensor is turned on, and the first limit sensor and the second limit sensor are turned off, at the first node in the second group.

According to an embodiment, to secondarily align the target inside the input group, the output group, or the bridge group, the target may be determined whether to be sensed between the nodes included in the input group, the output group, and the bridge groups, and the first limit sensor may be verified whether to be turned off at a last node in the group in which the target is sensed.

According to an embodiment, driving motors at all nodes in the group may be driven in a direction of the first limit sensor, when the first limit sensor is turned off.

According to an embodiment, the driving of the driving motors may be stopped when the correct position sensor is turned off at one node of two nodes in which the target is sensed, and when the correct position sensor is turned on, and the first limit sensor and the second limit sensor are turned off at a remaining node of the two nodes.

According to an embodiment, the driving of the driving motors at the all nodes in the group may be stopped, when the target is not sensed for a preset time.

According to an embodiment, the control unit may re-operate the conveyor system, when all targets are completely aligned in the conveyor system.

According to an embodiment, the alignment may correspond to a case that the first limit sensor and the second limit sensor are turned off at each of all nodes included in the input group, the output group, and the bridge group.

According to an embodiment, the target may be a container in which wafers are received.

According to an exemplary embodiment, an alignment method using the conveyor system is disclosed.

The alignment method may include primarily aligning the target between some groups among the input group, the output group, and the bridge group and secondarily aligning the target inside the input group, the output group, or the bridge group.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Advantage points and features of the inventive concept and a method of accomplishing thereof will become apparent from the following description with reference to accompanying drawings and embodiments to be described in detail with reference to the accompanying drawings. However, the inventive concept may be embodied in various different forms, and should not be construed as being limited only to the illustrated embodiments. Rather, these embodiments are provided as examples so that this disclosure will be thorough and complete, and will fully convey the concept of the present invention to those skilled in the art. The inventive concept may be defined by scope of the claims.

Unless otherwise specified, all terms used herein, including technical or scientific terms, have the same meanings as those generally understood by those skilled in the art to which the inventive concept pertains. It will be further understood that terms used herein should be interpreted as having a meaning that is consistent with their meaning in the context of this disclosure and the relevant art and will not be interpreted in an idealized or overly formal sense unless expressly so defined in the inventive concept.

The terms used in the inventive concept are provided for the illustrative purpose, but the inventive concept is not limited thereto. As used herein, the singular terms are intended to include the plural forms as well, unless the context clearly indicates otherwise. Furthermore, it will be further understood that the terms "comprises", and/or various modifications, such as "comprising," "includes" and/or "including", when used herein, specify the presence of stated compositions, ingredients, components, steps, operations, and/or elements, but do not preclude the presence or addition of one or more other compositions, ingredients, components, steps, operations, and/or elements. In this specification, the term "and/or" indicates each of components, which are disclosed, or the combination of the components.

Although the terms first, second, etc. may be used herein to describe various components, these components should not be limited by these terms. These terms are used to distinguish one component from another component. For example, a first component discussed below could be termed a second component without departing from the technical scope of the inventive concept. Similarly, the second component could be termed the first component.

The singular forms are intended to include the plural forms unless the context clearly indicates otherwise. In addition, the shapes and the sizes of elements in accompanying drawings will be exaggerated for more apparent description.

The term "~unit" used throughout in the whole specification may serve as unit to process at least one function or operation and may refer to, for example, software or hardware such as field programmable gate array (FPGA) or application specific integrated circuit (ASIC). Otherwise, the term "~unit" is not limited to software or hardware. The term "~unit" may be configured to be present in a storage medium to be assigned with addresses and may be configured to reproduce one or more processors.

For example, the term "~unit" may include components, such as software components, object-oriented software components, class components, and task components, processes, functions, attributes, procedures, sub-routines, segments of a program code, drivers, firmware, a micro-code, a circuit, data, a database, data structures, tables, arrays, and parameters. A function provided for a component and "~unit" may be performed together with a plurality of components and "~unit", and may be integrated with another additional component.

Figure 1:
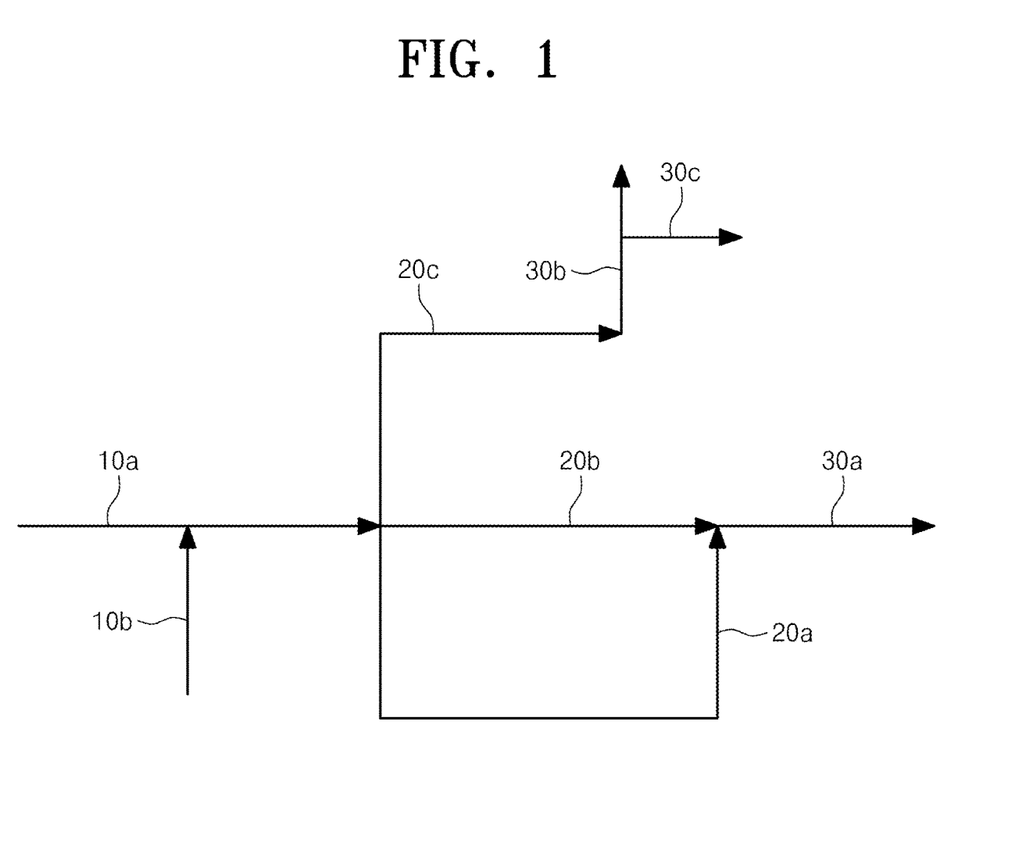
FIG. 1 is a view illustrating a group in a conveyor system in detail, according to the inventive concept.

FIG. 1 is a view illustrating a group in a conveyor system in detail, according to the inventive concept.

Before describing the conveyor system according to the inventive concept, the terminology used in the inventive concept will be defined below.

According to the inventive concept, a conveyor system 1 may include one or more input groups 10*a* and 10*b*, one or more output groups 30*a*, 30*b*, and 30*c*, and one or more bridge groups 20*a*, 20*b*, and 20*c*.

The input group may refer to a group to input a target. The output group may refer to a group to output the target. The bridge group refers to a group to connect the input group with the output group. A plurality of input groups, output groups, and bridge groups may be provided on one conveyor system. A group may refer to one of a plurality of conveyor lines.

Groups may be classified based on a split point of conveyor lines.

Referring to FIG. 1, the input group may include conveyor lines 10*a* and 10*b*, the output group may include conveyor lines 30*a*, 30*b*, and 30*c*, and the bridge group may include conveyor lines 20*a*, 20*b*, and 20*c*.

The input group may be a conveyor line for inputting a target from the outside.

A starting point of the input group may be on a line for inputting a target from the outside. An end point of the input group may be a split point of one line. Alternatively, the end point of the input group may be a point for inputting a target to another line.

The output group may be a conveyor line for outputting a target to the outside.

An end point of the output group may be an end point of a line for outputting the target to the outside. The starting point of the output group may be an end point of the bridge group or a point at which a plurality of split points are collected.

The bridge group may be a group to connect the input group with the output group.

The input group, the output group, and the bridge group may be classified when a branch point is made as a target moves in a conveyor direction. In this case, the input group, the output group, and the bridge group may be classified based on a rotational node serving as the split point when groups are classified. The rotational node may refer to a node to change a forward direction in a conveyor.

The rotational node may be regarded as being in a separate bridge group.

The input group, the output group, and the bridge group may be provided in plural. In the conveyor system, the target may be moved from the input group to the output group through the bridge group. The target may be moved from one input group to a plurality of output groups.

Figure 2:
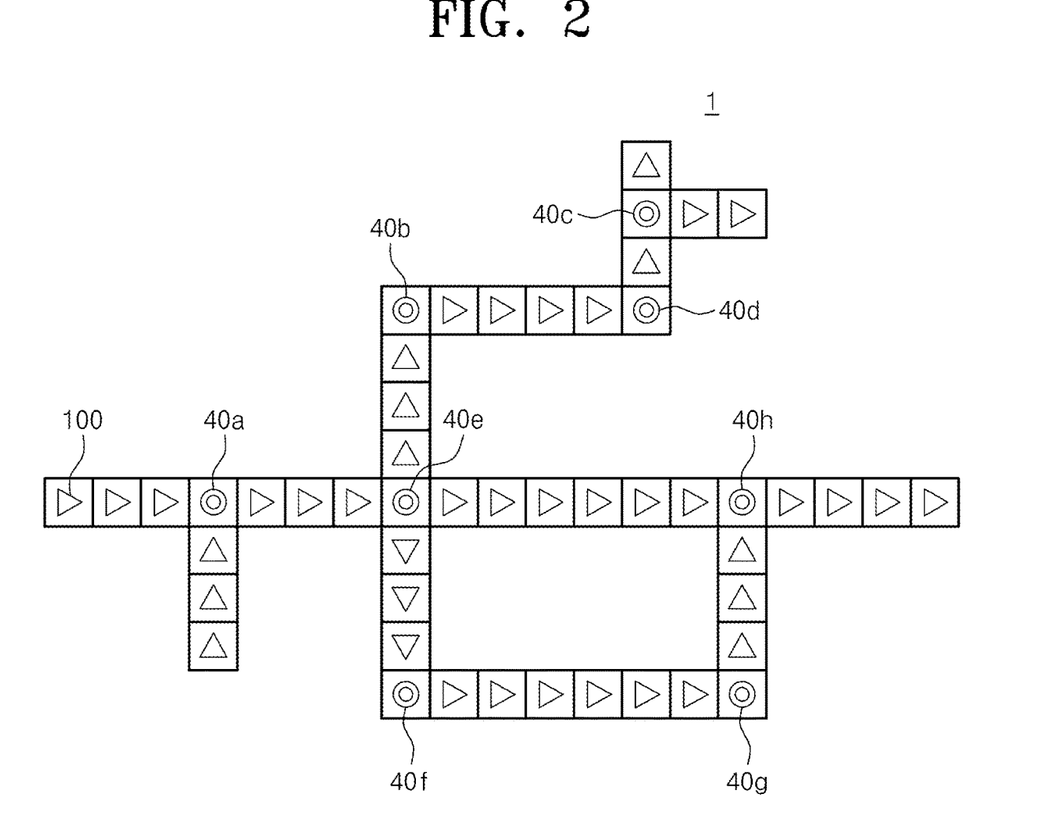
FIG. 2 is a view illustrating that a group includes a node in a conveyor system, according to the inventive concept.

FIG. 2 is a view illustrating that a group in the conveyor system includes a node, according to the inventive concept. This is a view corresponding to FIG. 1.

All of the input group, the output group, and the bridge group may include one or more nodes 100. The nodes 100 may be formed in equal sizes. The size of the node 100 may be provided to be larger than the size of the target. According to an embodiment, all groups may include an input node, an output node, and a plurality of bridge nodes.

In FIG. 2, a triangle marked on the node 100 indicates the direction of the conveyor.

Referring to FIG. 2, there is provided nodes having two circles overlapped, on the nodes 100. The nodes are rotational nodes 40a to 40h. The rotational nodes 40a to 40h may be to change the forward direction on the conveyor belt.

The rotational node may be regarded as being in a separate bridge group.

Figure 3:
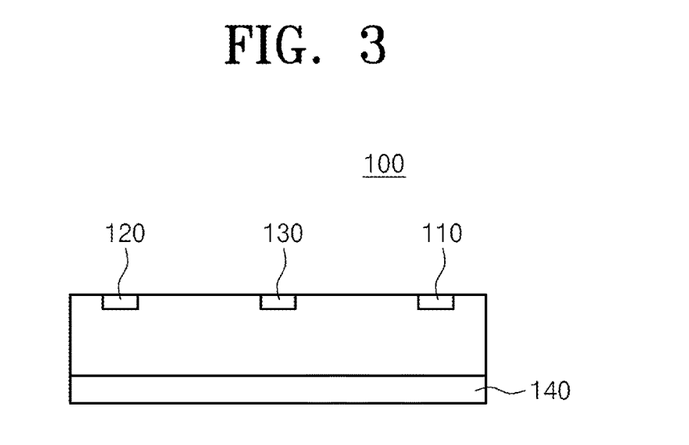
FIG. 3 is a view illustrating a configuration of a node, according to the inventive concept.

FIG. 3 is a view illustrating a configuration of the node 100, according to the inventive concept.

The node 100 may include a driving motor 140 to drive the node 100. The driving motor 140 may provide driving force such that a target disposed at the upper portion of the node 100 moves to another node.

The node 100 may include a correct position sensor 130 to sense whether the target is disposed on the node 100.

The correct position sensor 130 may be processed to be turned on when the target is disposed on the node 100. The correct position sensor 130 may be processed to be turned off when the target is not disposed on the node 100. The correct position sensor 130 may be disposed at the center of the node 100.

The node 100 may include a first limit sensor 110 and a second limit sensor 120 to sense to whether the target is disposed at opposite ends of the node 100.

The first limit sensor 110 may be a positive limit sensor. The second limit sensor 120 may be a negative limit sensor. The first limit sensor 110 may be disposed at a right end of the node 100. The second limit sensor 120 may be disposed at a left end of the node 100.

The first limit sensor 110 or the second limit sensor 120 may be turned on when a target is disposed at the right end or left end of the node 100. When the target is disposed at the center of the node 100 without interfering with the opposite ends of the node 100, the first limit sensor 110 and the second limit sensor 120 may be turned off.

In other words, it may be determined whether the target is positioned at the edge of the node or not, depending on whether the limit sensor is turned on or off.

Although FIG. 3 illustrates that the first limit sensor 110 and the second limit sensor 120 are partially separated from the end of the node 100, the first limit sensor 110 and the second limit sensor 120 may be positioned more closely to opposite ends of the node 100.

The first limit sensor 110 in the node 100 may be a sensor positioned at the right side, on the assumption that the node is moved to the right side on the conveyor belt. The second limit sensor 120 may be a sensor positioned at the left side.

The first limit sensor may be a sensor positioned on a side surface making contact with the node later when the node moves on the conveyor belt. The second limit sensor may be a sensor positioned on a side surface through which the node passes first, when the node moves on the conveyor belt.

The first limit sensor and the second limit sensor in the rotational node may be varied depending on the forward direction of the rotational node.

When the target is disposed on the correct position of the node, the target may be tracked, and the conveyor system may be operated again. In this case, the correct position may refer to the case that the first limit sensor and the second limit sensor are turned off in nodes included in all groups. In this case, since targets on the conveyor system are disposed at any nodes without interference with opposite ends, or another node is in the completely empty state, the target may be considered as being at the correct position and may be automatically aligned.

According to the inventive concept, the conveyor system may further include a control unit.

The control unit may control a target on the conveyor system to be automatically aligned when the target may not be aligned. According to the inventive concept, the control unit may primarily perform alignment between mutually different groups and secondarily perform alignment inside one group. The details of the alignment method will be described with reference to accompanying drawings.

The configuration of the node illustrated in FIG. 3 is provided for the illustrative purpose, and some components may be provided in different structures on the condition that a component to perform the same function is included.

Figure 4:
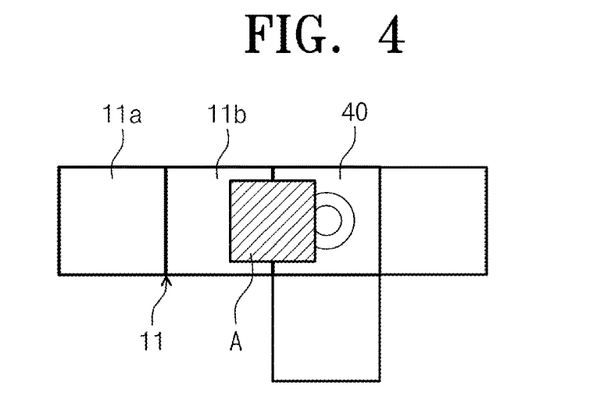
FIGS. 4 to 6 are views illustrating that primary alignment is performed, according to the inventive concept.
Figure 5:
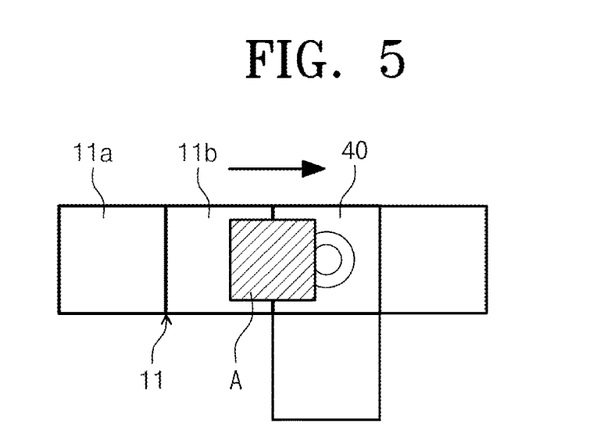
Figure 6:
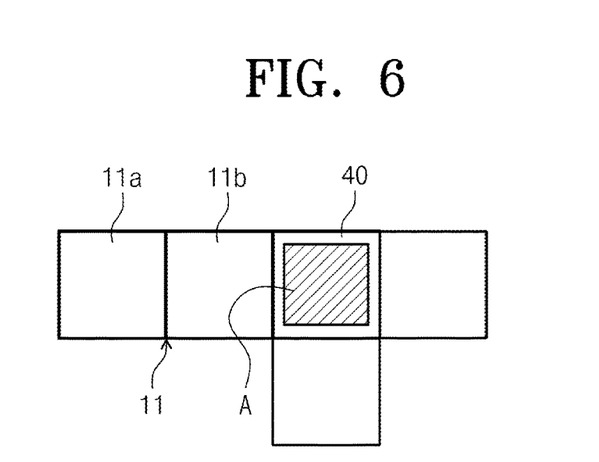

FIGS. 4 to 6 are views illustrating that the primary alignment is performed according to the inventive concept.

Referring to FIGS. 4 to 6, three groups are disclosed at the left, right and down sides from the rotational node 40. Although only one node is disclosed at each of the right side and the down side from the rotational node 40, the details thereof will be omitted for clarity. According to an embodiment, a plurality of nodes are linked to each other to form a group.

Referring to FIG. 4, one embodiment is disclosed in which a target A is stopped on the boundary between an input group 11 and the rotational node 40 when the conveyor system is stopped. As described above, the rotational node 40 may be considered as one bridge group. The input group 11 includes a node 11a and a node 11b.

According to an embodiment of FIG. 4, the target A corresponds to a target for primary alignment between mutually different groups, as the first limit sensor of the last node 11b in the input group 11 is turned on and the second limit sensor of the rotational node (group) 40 is turned on.

First, two groups in which the target A is disposed may be specified. Referring to FIG. 4, two groups correspond to the input group 11 and the rotational node 40. After the two groups are specified, the first group and the second group are sequentially specified in the forward direction of the conveyor. Accordingly, on the assumption that a conveyor belt is forwarded in a right direction, the first group is the input group 11 and the second group is the rotational node 40.

The input group 11 and the rotational node 40 may be arranged in a line and may be aligned because there is no additional obstacle.

FIG. 5 is a view illustrating that a motor is driven in the primary alignment.

Referring to FIG. 5, a motor at the last node 11b in the first group, that is, the input group 11 and a motor at the first node in the second group, that is, the rotational node 40 are driven.

In FIG. 5, since the second group includes only one node, although the rotational node 40 is driven, the first node may be driven in the second group including a plurality of nodes.

FIG. 6 is a view illustrating a result obtained by finishing the alignment of the target inside the group. Referring to FIG. 6, when the motor of the last node 11b in the first group and a motor at the rotational node 40 are driven, the target is moved in the right direction, that is, the forward direction of the conveyor belt. According to the moving result, when the correct position sensor at the node 11b is turned off, the correct position sensor at the rotational node 40 is turned on, and the first limit sensor and the second limit sensor at the rotational node 40 are turned off, the driving of the motor may be stopped.

Through this procedure, the target may be aligned between the first group and the second group which are different from each other.

Figure 7:
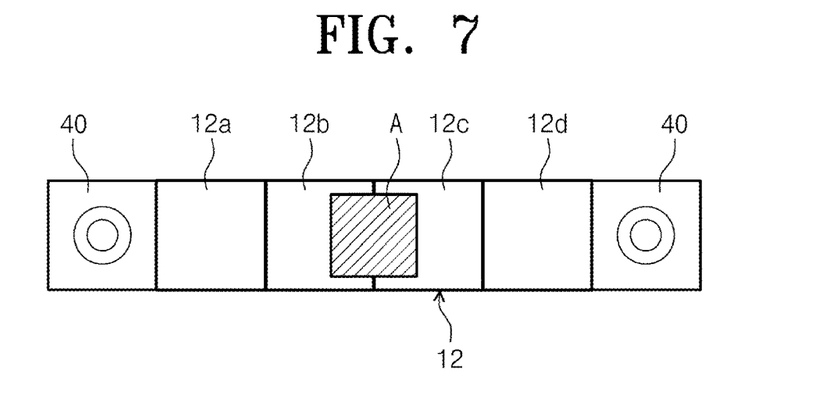
FIGS. 7 to 9 are views illustrating that secondary alignment is performed, according to the inventive concept.
Figure 8:
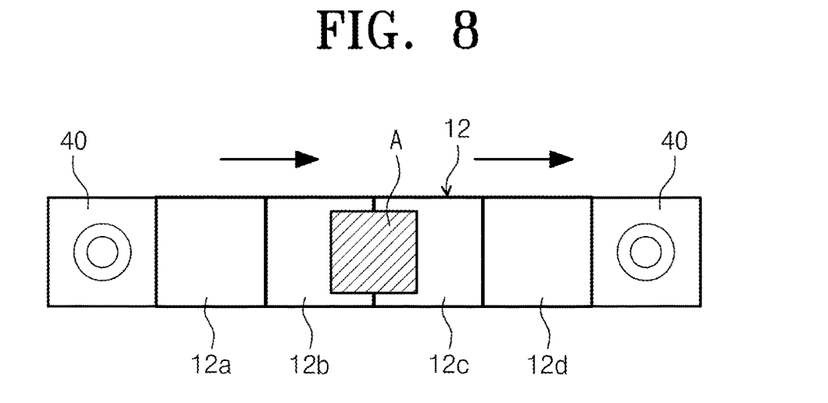
Figure 9:
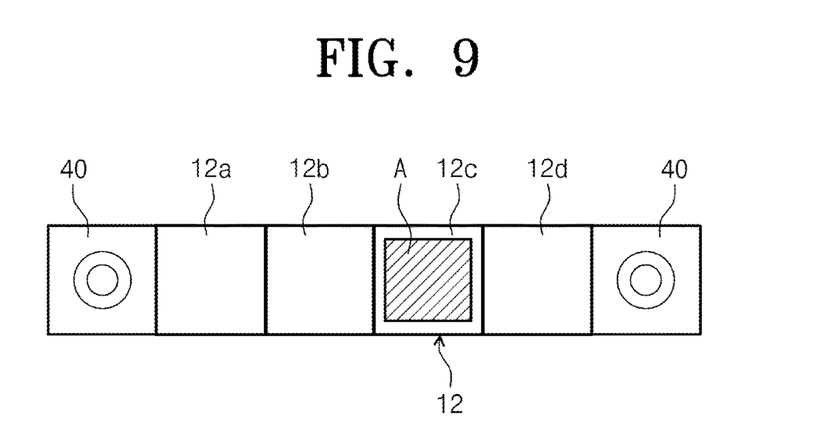

FIGS. 7 to 9 are views illustrating that the secondary alignment is performed according to the inventive concept.

Referring to FIGS. 7 to 9, disclosed is a structure in which rotational nodes 40 are disposed at opposite ends and one bridge group 12 is connected between the rotational nodes 40. The bridge group 12 may include four nodes 12a, 12b, 12c, and 12d.

Referring to FIG. 7, a structure is disclosed in which the target A is disposed on the boundary between the nodes 12b and 12c inside the group.

In FIG. 7, whether the target is sensed at the node inside the group may be determined depending on the sensing state of the first limit sensor and the second limit sensor in each of a plurality of nodes inside the group.

In FIG. 7, it may be confirmed that the first limit sensor at the node 12b and the second limit sensor at the node 12c are turned on.

FIG. 8 illustrates that a motor is driven for the alignment in an embodiment of FIG. 7.

The method for aligning the target inside the group may drive motors at all nodes included inside the group. In other words, according to an embodiment of FIG. 8, motors in node 12a, 12b, 12c, and 12d may be driven.

FIG. 9 is a view illustrating the result obtained by finishing the alignment of the target inside the group. Referring to FIG. 9, when the motor inside the group is driven, the target is moved in the right direction. In other words, when the correct position sensor at the node 12b is turned off, the correct position sensor at the node 12c is turned on, and the first limit sensor and the second limit sensor at the node 12c are turned off, the driving of the motor may be stopped.

The alignment of the target inside the group may be performed through this procedure.

The inventive concept may be applied to the case that the conveyor system is stopped after driving. The case that the driving of the conveyor system is stopped may be the situation that the blackout or system failure occurs in the conveyor system. To resume the driving of the conveyor system, the target has to be aligned at the correct position of the conveyor node. This is because the target may be tracked when the target is disposed at the correct position of the conveyor node. According to the inventive concept, the target may be automatically aligned such that the target is disposed at the correct position on the node. According to the inventive concept, automatic alignment logic may be realized by primarily performing the alignment between and secondarily performing the alignment inside the group as defined in the inventive concept.

According to the inventive concept, the target may be a container in which wafers are received. According to the inventive concept, the target is not limited thereto. For example, various targets may be extensively employed as long as the targets are movable through the conveyor. In other words, the inventive concept may be used for a system movable through the conveyor to track a position. The tracking of the position refers to identifying a position at which a target is present.

Figure 10:
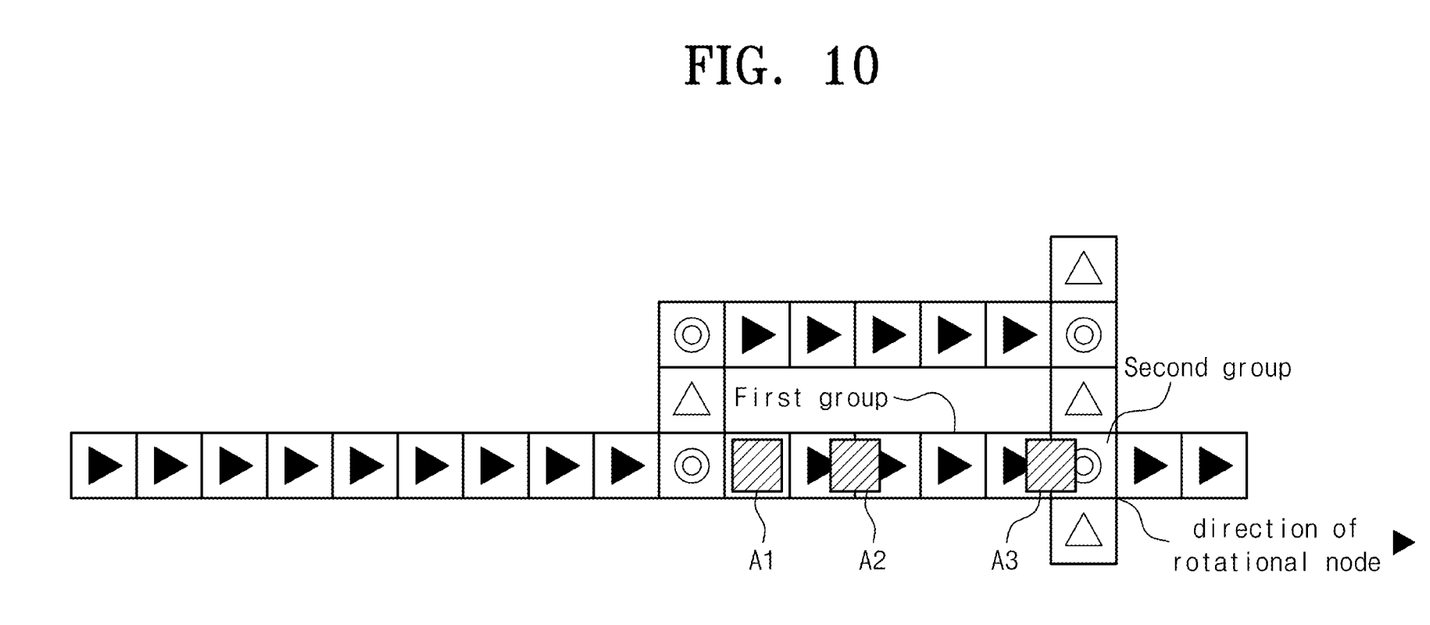
FIG. 10 is a view illustrating that alignment is performed in a conveyor system, according to an embodiment of the inventive concept.

FIG. 10 is a view illustrating that alignment is performed in a conveyor system, according to an embodiment of the inventive concept.

FIG. 10 is a view illustrating that target A1, A2, and A3 are stopped after moving on the conveyor system, according to an embodiment. The following description will be made regarding that alignment is performed on the conveyor system according to an embodiment illustrated in FIG. 10.

Referring to FIG. 10, two input groups and four rotational nodes are disclosed, four bridge groups are disclosed to connect the input groups with the rotational nodes, and two output groups are disclosed. The targets A1, A2, and A3 are disclosed.

Regarding alignment sequence, the alignment inside the group should be performed after the alignment between the groups. When the alignment inside the group is first performed before the alignment between the groups, an influence may be exerted on a target on the boundary between the groups during the alignment procedure inside the group. Accordingly, the alignment between the groups, which are in a broader concept, may be first performed.

To primarily perform the alignment between the groups and secondarily perform the alignment inside the group, whether a target is on the boundary between the groups is first considered.

The sensing states of limit sensors at nodes of opposite ends of all groups are considered. In FIG. 10, a target is sensed by a first limit sensor at the last node in the first group, and a target is sensed by a second limit sensor of the second group. Accordingly, the alignment for the target A3 may be first performed.

A group, in which the target A3 serving as a target on the boundary between the groups is disposed, is specified. Referring to FIG. 10, the first group and the second group may be specified. In FIG. 10, it is determined whether the first group and the second group are connected with each other in a line. Since the first group and the second group are connected with each other in a line, a next stage is performed. In this case, a group first disposed in the forward direction of the conveyor is determined. Referring to FIG. 10, the second group is disposed after the first group.

When the groups are specified, the last node in the first group is compared with the first node in the second group to check whether the alignment is possible. When another failure is present other than the target, the alignment performed by merely driving the motor may be failed. Accordingly, that the alignment performed by merely driving the motor may be failed may be notified to the user. When a specific is absent other than that the target is disposed, it may be determined that the alignment is possible, and the motors included at the last node in the first group and the first node in the second group are driven in the forward direction of the conveyor. According to the driving result, when the last node in the first group is in an empty state, the correct position sensor at the first node of the second group is turned on, and the first limit sensor and the second limit sensor are turned off at the first node of the second group, it is determined that the alignment is completed, and the driving of the motors included at the last node of the first group and the first node of the second group may be stopped. After the above procedure, it may be determined that the alignment for the target A3 is completed.

When the alignment between the groups is completed, the secondary alignment, which is the alignment inside the group, is performed.

To perform the secondary alignment, it is determined whether the first limit sensors at the last nodes in all groups are turned off. It is determined that the first limit sensors at the last nodes are turned off because the first limit sensors are associated with the forward direction of the conveyor.

When a limit sensor is turned on at the end of the last node inside the group in the forward direction of the conveyor, and when the motor inside the group is driven, the interference between the groups may be caused. When the limit sensor is turned on at the end of the last node inside the group in the forward direction of the conveyor, the alignment between the groups, that is, the primary alignment may be performed.

When the first limit sensor at the last node in all groups is turned off, motors may be driven at all nodes in the group in the forward direction of the conveyor. Referring to FIG. 10, the motors may be driven at all nodes included in the first group. When the correct position sensor at the node is turned off after the motors at all nodes are driven, when the correct position sensor at another node is turned on, and when the first limit sensor and the second limit sensor at the relevant nodes are turned off, the driving of the motor may be stopped. When there is absent a target passing through a relevant node for a preset time after the motors at all nodes in the first group are driven, the driving of the relevant motor may be stopped. The motor may be efficiently used through the above manner. The preset time may be in the range of five seconds or ten seconds.

Accordingly, as the targets A1 and A2 are aligned in the first group, all targets A1, A2, and A3 may be completely aligned in the conveyor system. Accordingly, all targets in the conveyor system may be tracked, and the driving of the conveyor system may be performed again.

Figure 11:
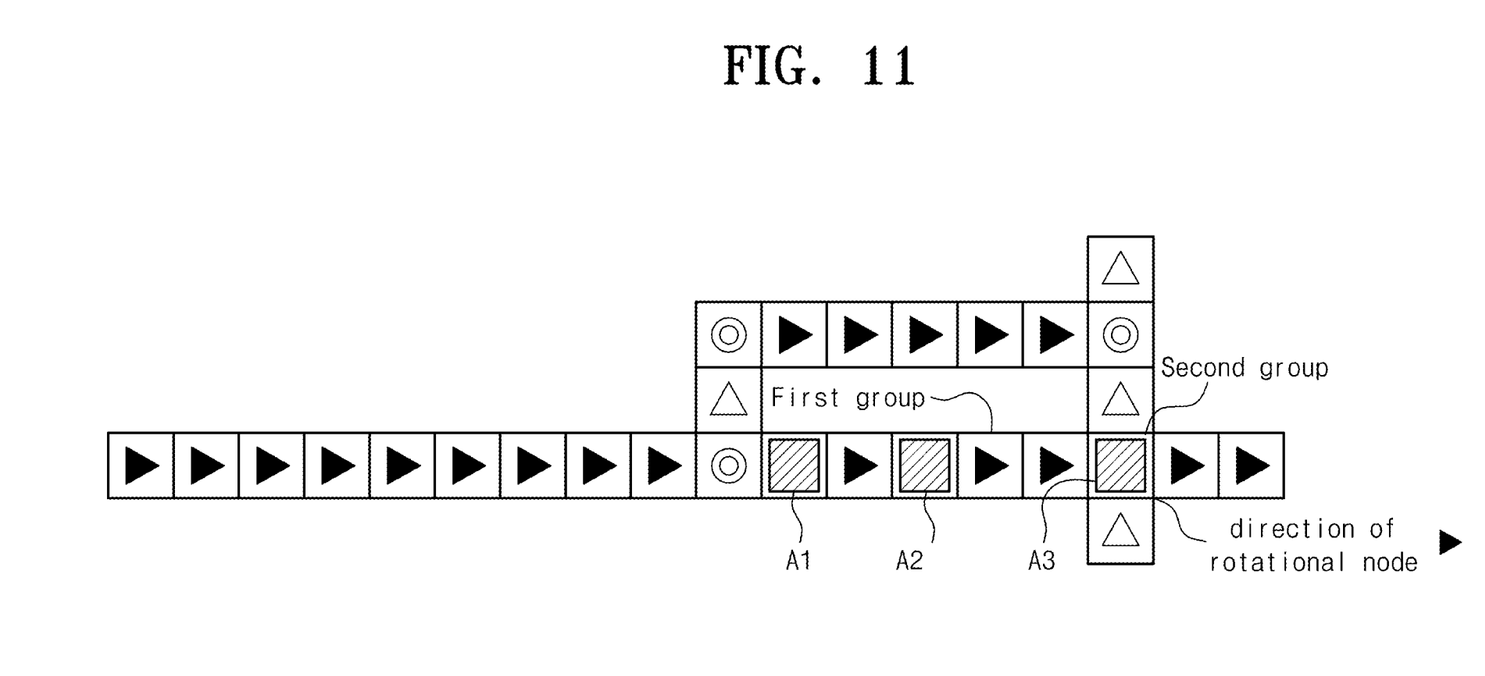
FIG. 11 is a view illustrating a result obtained as the alignment according to the inventive concept is performed in an embodiment of FIG. 10.

FIG. 11 is a view illustrating a result obtained as the alignment according to the inventive concept is performed in the embodiment of FIG. 10.

As result obtained as the alignment according to the inventive concept is performed in the embodiment of FIG. 10, all targets are disposed at the correct position on the node, so the conveyor system may be operated again.

Figure 12:
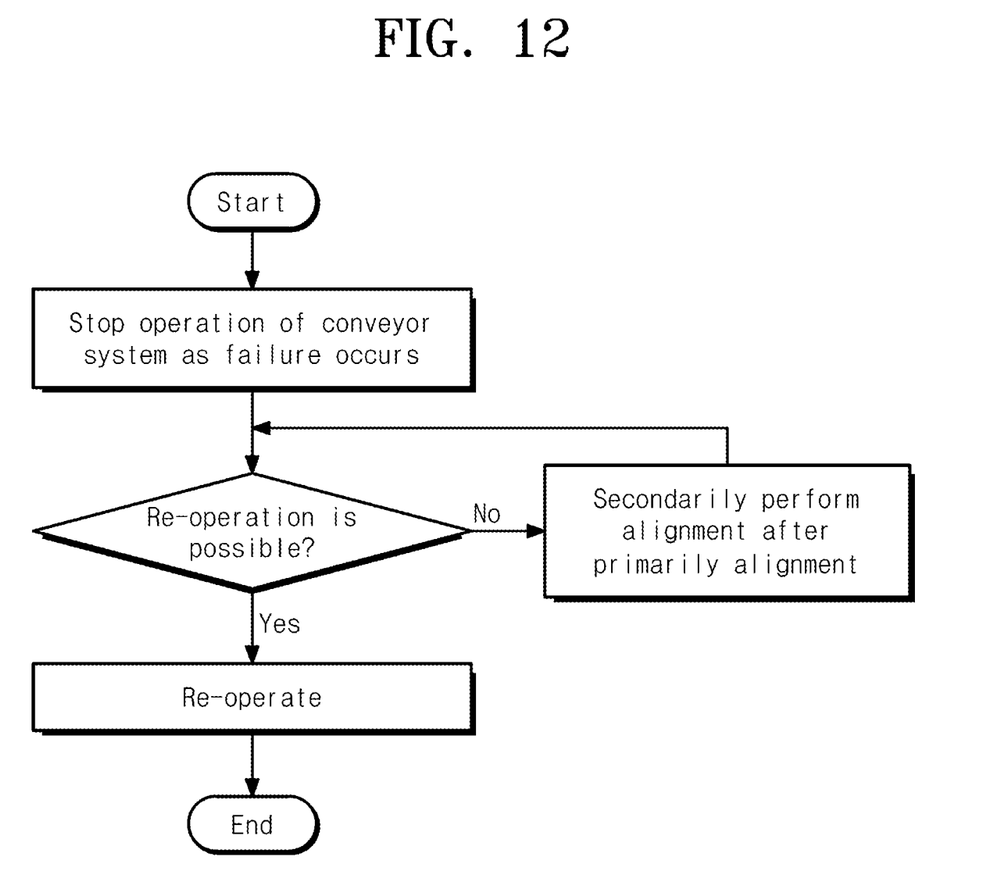
FIG. 12 is a flowchart simply illustrating an alignment method, according to the inventive concept.

FIG. 12 is a flowchart simply illustrating an alignment method according to the inventive concept.

Referring to FIG. 12, the operation of the conveyor system according to the inventive concept may be stopped. The operation may be stopped due to various causes. According to an embodiment, the operation may be stopped due to the blackout or the system failure. When the operation of the conveyor system is stopped, the control unit of the conveyor system may determine whether the conveyor system is operated again.

To operate the conveyor system again, the alignment of a target moving on the conveyor system should be completed. When the alignment is completed, the target may be tracked, so the conveyor system is re-operated.

Although the operation of the conveyor system is stopped, when the alignment of the target is completed as the review result for the re-operation, the re-operation may be performed.

When the target is not completely aligned as the review result of the re-operation, it has to be reviewed whether the alignment is finished after the alignment of the target is performed. When the alignment is not finished, the alignment is performed again. The alignment of the target may be performed in the sequence of the primary alignment and the secondary alignment.

An alignment method for a target will be described with reference to FIG. 13.

Figure 13:
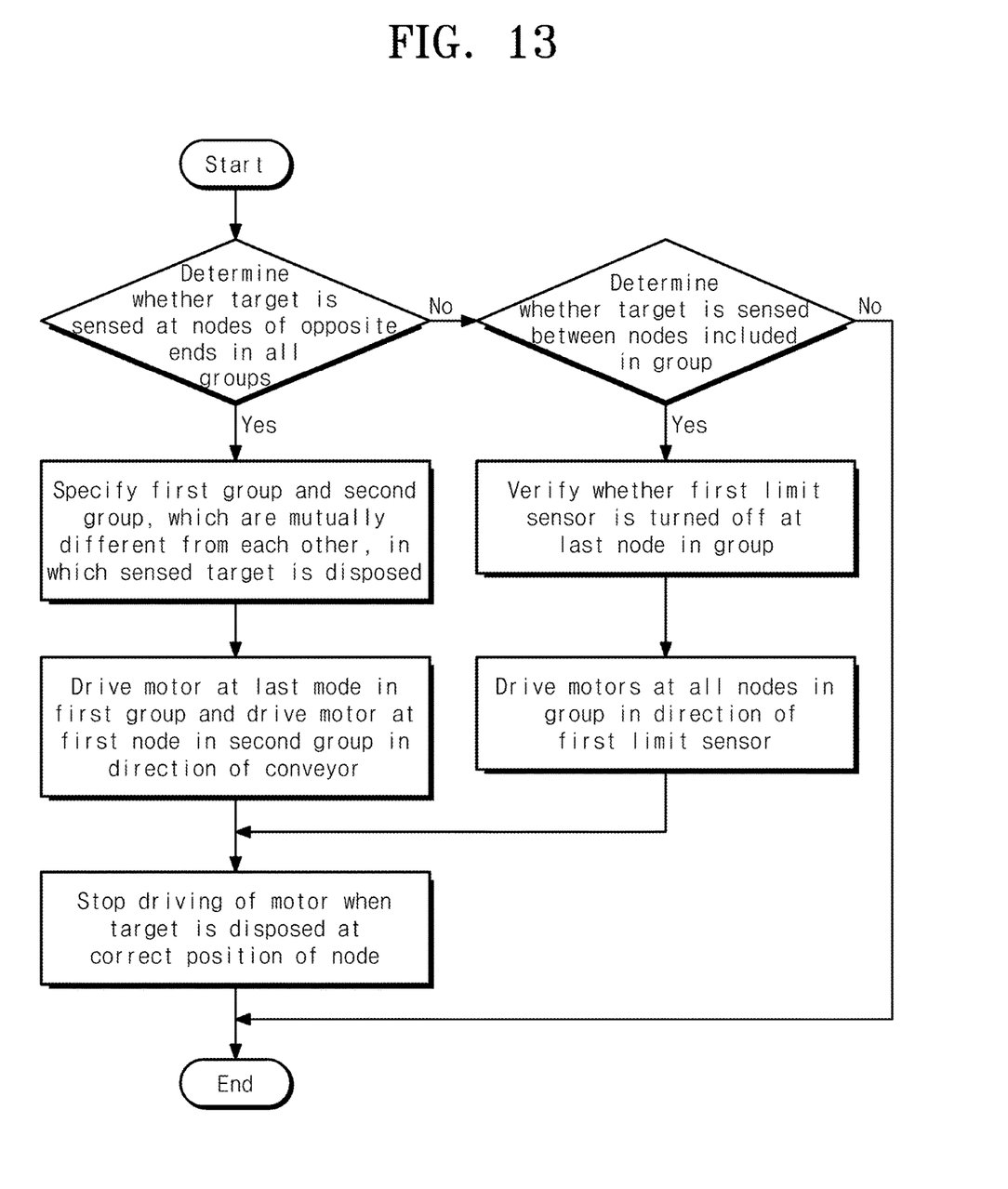
FIG. 13 is a flowchart illustrating the alignment method in the conveyor system, according to the inventive concept.

FIG. 13 is a flowchart illustrating the alignment method in the conveyor system according to the inventive concept.

Before performing the alignment method illustrated in FIG. 13, the conveyor system according to the inventive concept may classify rails thereon into an input group, an output group, and a bridge group. The groups may include a plurality of nodes having the size corresponding to the size of the target. Since the classification manner of the groups has been described above in detail, the details thereof will be omitted.

According to the inventive concept, the conveyor system may determine whether targets at nodes of opposite ends in all groups included in the conveyor system are sensed, in the state that the conveyor system is stopped. In more detail, it may be determined whether targets are sensed by the first limit sensor at a node of an end in each group in the forward direction and the second limit sensor at a node of a reverse end in each group in a reverse direction. This determination may be made with respect to all groups.

In this case, when targets are sensed at nodes of opposite ends in all groups, the primary alignment is performed. In this case, the first group and the second group, which are different from each other, are specified, in which the sensed target is on the boundary between the first group and the second group. After the first group and the second group are specified, it is determined whether the first group and the second group are arranged in a line.

When the first group and the second group are arranged in a line, the groups are specified such that the second group is aligned after the first group in the forward direction of the conveyor.

After the first group and the second group are specified, it is determined whether another obstacle is absent between the first group and the second group and determined whether the alignment is possible through the driving of the motor.

When the alignment is possible, a motor for driving at the last node in the first group and a motor for driving at the first node in the second group may be simultaneously driven in the forward direction of the conveyor. The last node in the first group may refer to a node at the last position in the first group when viewed in the forward direction of the conveyor. The first node in the second group may refer to a node at the first position in the second group when viewed in the forward direction of the conveyor.

When a target is placed at a correct position of the node after simultaneously driving the motor for driving at the last node in the first group and the motor for driving at the first node in the second group, the primary alignment is completed.

In this case, the correct position may refer to the case that the first limit sensor and the second limit sensor are turned off in all nodes included in all groups. In this case, the target is positioned in the state that the first limit sensor and the second limit sensor are turned off at the node. Accordingly, the alignment is completed when the condition is satisfied in all nodes.

The following description will be made regarding the secondary alignment.

When a target is not sensed at nodes of opposite ends in all groups, it is determined whether the target is sensed at a plurality of nodes positioned inside all groups.

In more detail, it may be determined whether the target is sensed by the first limit sensor and the second limit sensor included in the plurality of nodes positioned inside each group. This may be determined with respect to all groups.

When the targets are sensed at the plurality of nodes positioned inside the groups, the second alignment which is the alignment inside each group is performed.

In the secondary alignment, it is determined whether the first limit sensor is turned off at the last node inside the group. The last node inside the group may refer to a node at the last position in the group when viewed in the forward direction of the conveyor. As it is determined whether the first limit sensor is turned off at the last node inside the group, it may be determined whether the alignment between the groups should be performed.

After determining whether the first limit sensor is turned off at the last node inside the group, motors at all nodes inside the group in the direction of the first limit sensor may be driven.

The motors at all nodes inside the group are driven to prevent the collision between other targets, which has been already aligned, which may be caused when motors are driven only in some nodes for alignment.

Accordingly, when the targets inside the group are aligned at the correct position, the secondary alignment is finished.

As described above, after the primary alignment and the secondary alignment are performed, all targets included in the conveyor system are disposed at the correct positions of the nodes. Accordingly, since the targets at all nodes are tractable, the conveyor system may be operated again.

According to the inventive concept, the plurality of targets present at positions, at which the targets are not tracked, may be automatically aligned such that the targets are tractable.

According to the inventive concept, the conveyor system may be rapidly operated again as the alignment is able to be rapidly performed.

The effects produced in the inventive concept are not limited to the aforementioned effects, and any other effects not mentioned herein will be clearly understood from the detailed description and accompanying drawings by those skilled in the art to which the inventive concept pertains.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative. The drawings provided in the inventive concept merely illustrate the best mode of the inventive concept. Accordingly, the technical scope of the inventive concept is not limited to the detailed description of this specification, but should be defined by the claims. It should be understood that the technical protection scope of the inventive concept is not limited to the literary description of the claims itself, but actually the technical value extends even to the invention of the equal scope.

What is claimed is:

1. A conveyor system for moving a plurality of targets, the conveyor system comprising:
    at least one input group configured to input the target;
    at least one output group configured to output the target; and
    at least one bridge group configured to connect the input group with the output group,
    wherein each of the input group, the output group, and the bridge group includes a plurality of nodes having a size corresponding to a size of one target,
    wherein the plurality of nodes include at least one rotational node for changing a forward direction of the at least one input group, the at least one output group, or the at least one bridge group, and
    wherein the conveyor system further includes:
    a control unit configured to align the target moving on the conveyor system.

2. The conveyor system of claim 1, wherein each node includes:
    a correct position sensor;
    a first limit sensor configured to sense whether the target is positioned at one end of the node;
    a second limit sensor configured to sense whether the target is positioned at another end of the node; and
    a driving motor configured to drive the node.

3. The conveyor system of claim 2, wherein the control unit is configured to:
    primarily align the target between some groups among the input group, the output group, and the bridge group; and
    secondarily align the target inside the input group, the output group, or the bridge group, when aligning the target moving on the conveyor system.

4. The conveyor system of claim 3, wherein, to primarily align the target between some groups among the input group, the output group, and the bridge group,
    the target is determined whether to be sensed at nodes in opposite ends of each of the input group, the output group, and the bridge group, and
    a first group and a second group, in which the target sensed is disposed, are specified, and determined whether to be linked to each other in a line in a forward direction of a conveyor, when the target is sensed.

5. The conveyor system of claim 4, wherein a driving motor at a last node in the first group and a driving motor at a first node in the second group are driven in the forward direction of the conveyor.

6. The conveyor system of claim 5, wherein the control unit is configured to:
    perform a control operation to stop driving of the driving motors when the correct position sensor at the last node in the first group is turned off, and when the correct position sensor is turned on, and the first limit sensor and the second limit sensor are turned off, at the first node in the second group.

7. The conveyor system of claim 3, wherein, to secondarily align the target inside the input group, the output group, or the bridge group,
    the target is determined whether to be sensed between the nodes included in the input group, the output group, and the bridge groups, and the first limit sensor is verified whether to be turned off at a last node in the group in which the target is sensed.

8. The conveyor system of claim 7, wherein driving motors at all nodes in the group are driven in a direction of the first limit sensor, when the first limit sensor is turned off.

9. The conveyor system of claim 8, wherein the driving of the driving motors is stopped when the correct position sensor is turned off at one node of two nodes in which the target is sensed, and when the correct position sensor is turned on, and the first limit sensor and the second limit sensor are turned off at a remaining node of the two nodes.

10. The conveyor system of claim 9, wherein the driving of the driving motors at the all nodes in the group is stopped, when the target is not sensed for a preset time.

11. The conveyor system of claim 10, wherein the control unit is configured to:
   re-operate the conveyor system, when all targets are completely aligned in the conveyor system.

12. The conveyor system of claim 11, wherein the alignment corresponds to a case that the first limit sensor and the second limit sensor are turned off at each of all nodes included in the input group, the output group, and the bridge group.

13. The conveyor system of claim 12, wherein the target is a container in which wafers are received.

* * * * *